United States Patent
Tukker et al.

(10) Patent No.: US 12,086,973 B2
(45) Date of Patent: Sep. 10, 2024

(54) DETECTION APPARATUS FOR SIMULTANEOUS ACQUISITION OF MULTIPLE DIVERSE IMAGES OF AN OBJECT

(71) Applicant: ASML Netherlands B.V., Veldhoven (NL)

(72) Inventors: Teunis Willem Tukker, Eindhoven (NL); Arie Jeffrey Den Boef, Waalre (NL); Nitesh Pandey, Eindhoven (NL); Marinus Petrus Reijnders, Eindhoven (NL); Ferry Zijp, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 194 days.

(21) Appl. No.: 17/608,015

(22) PCT Filed: Apr. 2, 2020

(86) PCT No.: PCT/EP2020/059328
§ 371 (c)(1),
(2) Date: Nov. 1, 2021

(87) PCT Pub. No.: WO2020/229049
PCT Pub. Date: Nov. 19, 2020

(65) Prior Publication Data
US 2022/0172347 A1    Jun. 2, 2022

(30) Foreign Application Priority Data

May 13, 2019 (EP) .................................. 19174102
May 23, 2019 (EP) .................................. 19176202
(Continued)

(51) Int. Cl.
*G06T 7/00* (2017.01)
*G01N 21/47* (2006.01)
(Continued)

(52) U.S. Cl.
CPC ....... *G06T 7/0004* (2013.01); *G01N 21/4788* (2013.01); *G02B 5/3083* (2013.01);
(Continued)

(58) Field of Classification Search
CPC ......... G06T 7/0004; G06T 2207/10148; G06T 2207/30148; G01N 21/4788;
(Continued)

(56) References Cited

U.S. PATENT DOCUMENTS 5,719,704 A    2/1998   Shiraishi et al.
6,952,253 B2   10/2005  Lof et al.
(Continued)

FOREIGN PATENT DOCUMENTS

CN          101614585 A    12/2009
DE        102019201916 A1    4/2019
(Continued)

OTHER PUBLICATIONS

International Search Report and Written Opinion directed to related International Patent Application No. PCT/EP2020/059328, mailed Jul. 23, 2020; 8 pages.
(Continued)

*Primary Examiner* — Md M Rahman
(74) *Attorney, Agent, or Firm* — Sterne, Kessler, Goldstein & Fox P.L.L.C.

(57) ABSTRACT

Disclosed is a detection apparatus for simultaneous acquisition of multiple images of an object at a plurality of different focus levels; comprising: a modulator for obtaining multiple beam copies of an incoming beam; and a detector operable to capture said multiple beam copies, such that at two of said multiple beam copies are captured at different focus levels. Also disclosed is an inspection apparatus comprising such a detection system.

14 Claims, 8 Drawing Sheets

(30) Foreign Application Priority Data

Jun. 12, 2019 (EP) .................................... 19179763
Sep. 3, 2019 (EP) .................................... 19195127

(51) Int. Cl.
| | |
|---|---|
| *G02B 5/30* | (2006.01) |
| *G02B 27/28* | (2006.01) |
| *G02B 27/42* | (2006.01) |
| *G03F 7/00* | (2006.01) |

(52) U.S. Cl.
CPC ....... *G02B 27/283* (2013.01); *G02B 27/4205* (2013.01); *G03F 7/70616* (2013.01); *G03F 7/706851* (2023.05); *G06T 2207/10148* (2013.01); *G06T 2207/30148* (2013.01)

(58) Field of Classification Search
CPC  G02B 5/3083; G02B 27/283; G02B 27/4205; G03F 7/70616; G03F 7/706851; G03F 7/70633; G03F 7/70625
USPC ......................................................... 356/601
See application file for complete search history.

(56) References Cited

U.S. PATENT DOCUMENTS

| | | |
|---|---|---|
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2011/0292471 A1 * | 12/2011 | Matsuura ................ H04N 1/047 358/475 |
| 2012/0044470 A1 | 2/2012 | Smilde et al. |
| 2016/0061750 A1 * | 3/2016 | Den Boef ........... G03F 7/70141 356/496 |
| 2016/0161863 A1 | 6/2016 | Den Boef et al. |
| 2016/0341969 A1 | 11/2016 | Manger |
| 2019/0094702 A1 | 3/2019 | Shmarev et al. |
| 2019/0107781 A1 | 4/2019 | Tinnemans et al. |

FOREIGN PATENT DOCUMENTS

| | | | |
|---|---|---|---|
| EP | 1628164 B1 | 10/2010 | |
| EP | 2399098 A1 * | 12/2011 | ......... G01B 11/2441 |
| EP | 3480554 A1 | 5/2019 | |
| EP | 3531191 A1 | 8/2019 | |
| JP | 2000-077295 A | 3/2000 | |
| JP | 2005-283739 A | 10/2005 | |
| JP | 2014-106222 A | 6/2014 | |
| WO | WO 2011012624 A1 | 2/2011 | |

OTHER PUBLICATIONS

Choi, J., et al., "Spectral Diffraction Efficiency Characterization of Broadband Diffractive Optical Elements," Sandia National Laboratories Report SAND2013-2603, Sandia Corporation, Mar. 2013; 30 pages.

"Geometric Phase Lens," ImagineOptix (accessed Oct. 8, 2021 at http://www.imagineoptix.com/technology/geometric-phase-lens/); 3 pages.

Nicholson, A., "Multi-layer Diffractive Optical Element," Canon (accessed Oct. 18, 2021 at https://cpn.canon-europe.com/content/education/infobank/lenses/multi_layer_diffractive_optical_element.do/); 7 pages.

Chinese First Office Action directed to Chinese Patent Application No. 202080035028.2, mailed Feb. 7, 2024; 11 pages.

Korean Office Action directed to Korean Patent Application No. 10-2021-7037177, mailed Apr. 5, 2024; 10 pages.

\* cited by examiner

DETECTION APPARATUS FOR SIMULTANEOUS ACQUISITION OF MULTIPLE DIVERSE IMAGES OF AN OBJECT

CROSS REFERENCE TO RELATED APPLICATIONS

This application claims priority of EP application 19174102.4 which was filed on 2019 May 13 and EP application 19176202.0 which was filed on 2019 May 23 and EP application 19179763.8 which was filed on 2019 Jun. 12 and EP application 19195127.6 which was filed on 2019 Sep. 3 and which are all incorporated herein in their entirety by reference.

FIELD

The present invention relates to a metrology apparatus or an inspection apparatus for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

A metrology device may use computationally retrieved phase to improve aberration performance of an image captured by the metrology device. To help calculate phase, it is helpful to obtain a number of diverse images, such as multiple images of the same target under different focus conditions. This can increase acquisition time and reduce throughput, as multiple images are obtained sequentially at different focus settings.

SUMMARY

It is an object to reduce acquisition time and increase throughput when obtaining images comprising focus diversity.

Embodiments of the invention are disclosed in the claims and in the detailed description.

In a first aspect of the invention there is provided a detection apparatus for simultaneous acquisition of multiple images of an object at a plurality of different focus levels; comprising: a modulator for obtaining multiple beam copies of an incoming beam; and a detector operable to capture said multiple beam copies, such that at two of said multiple beam copies are captured at different focus levels.

BRIEF DESCRIPTION OF THE DRAWINGS

Embodiments of the invention will now be described, by way of example only, with reference to the accompanying schematic drawings, in which:

FIG. 11 is a schematic illustrations illustration of a further phase plate usable to obtain a wavelength dependent focus change, according to an embodiment of the invention;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
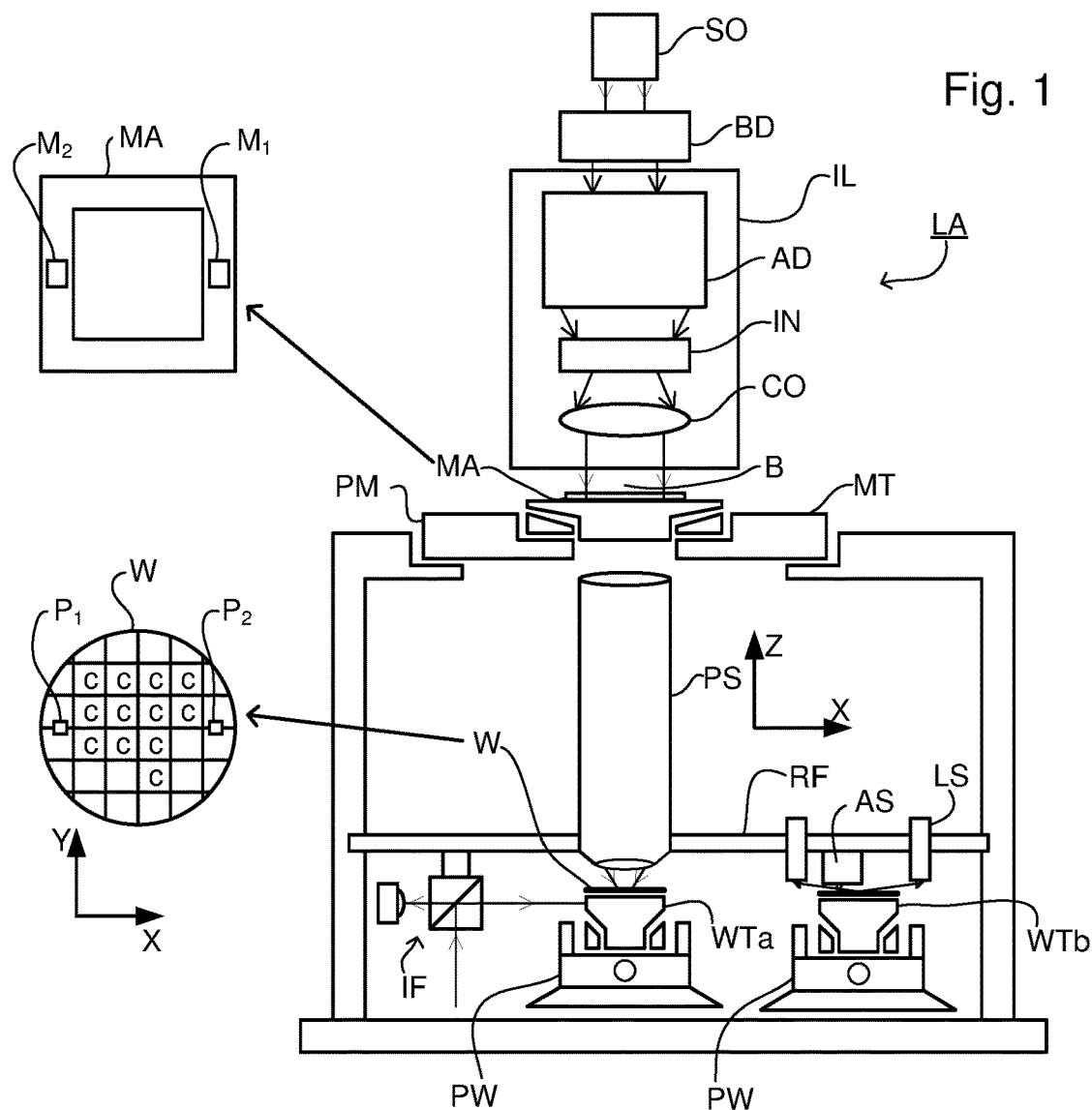
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
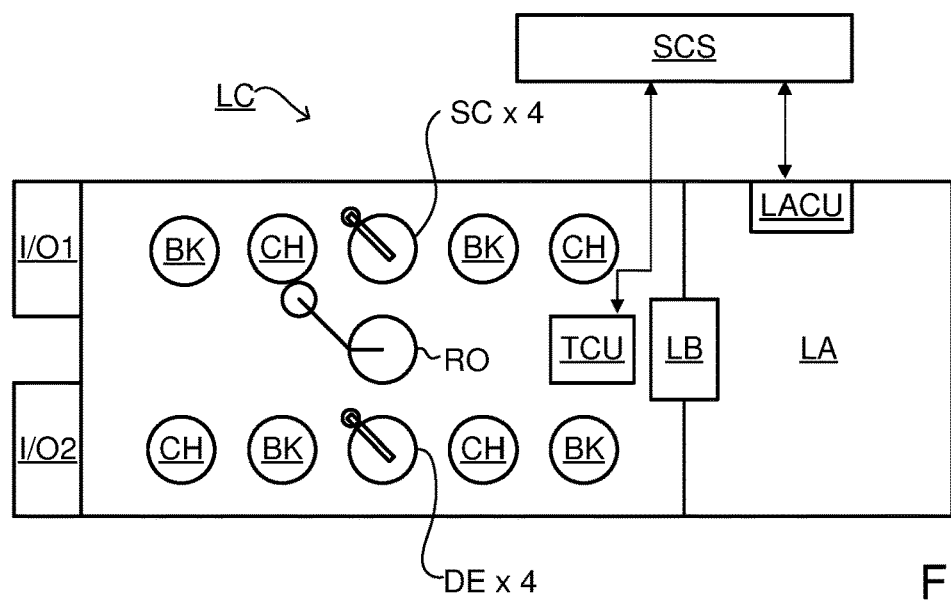
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
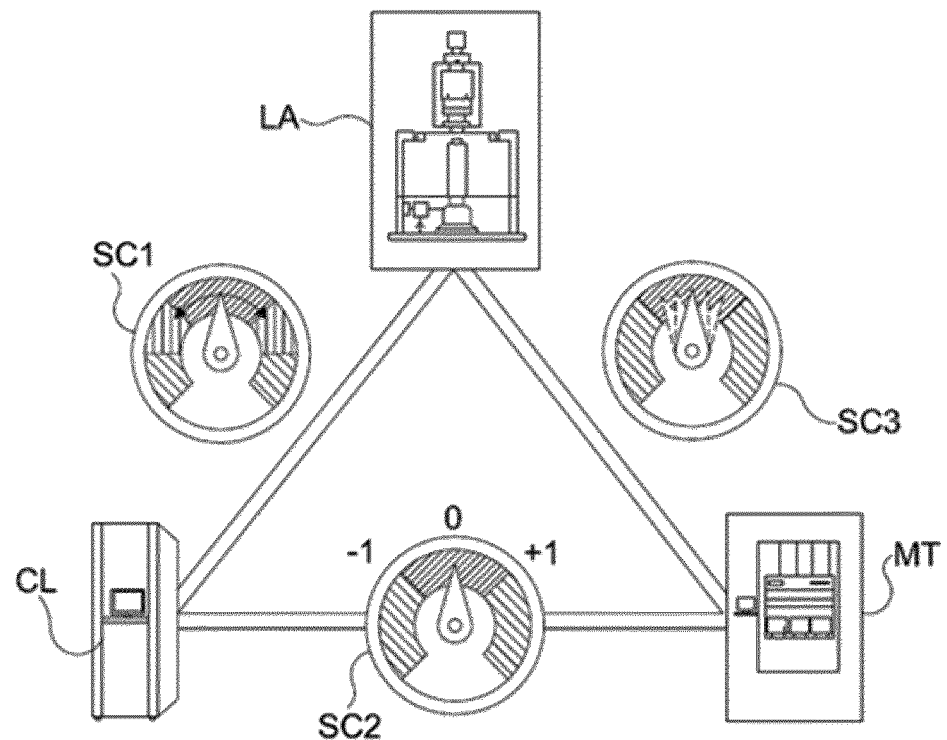
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from from multiple gratings using light from soft x-ray and visible to near-IR wave range.

Figure 4:
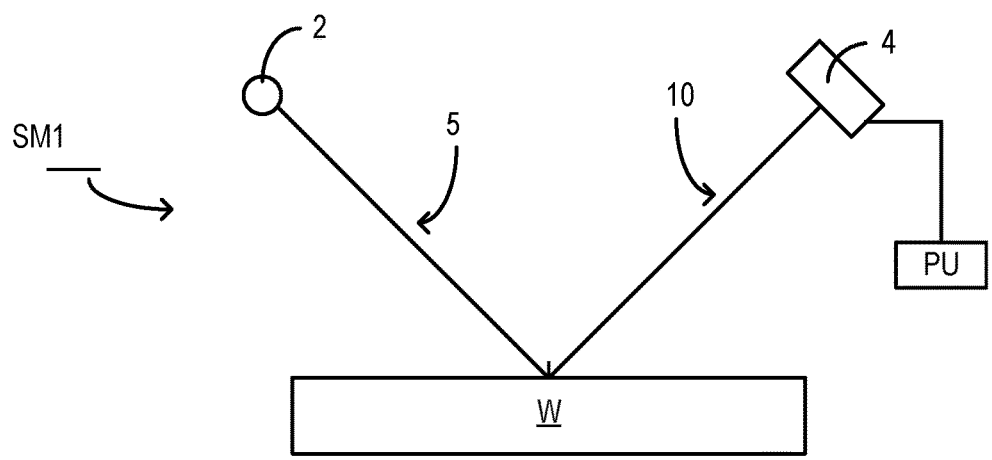
FIG. 4 is a schematic illustration of a scatterometry apparatus.
Figure 4:
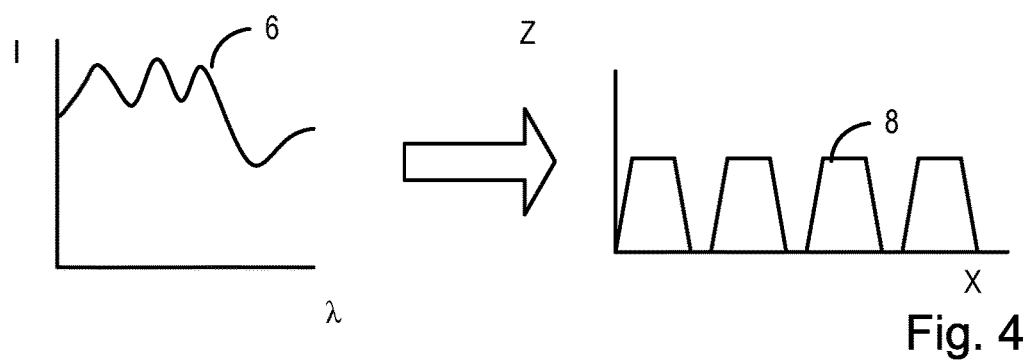

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

A metrology apparatus which employs a computational imaging/phase retrieval approach has been described in US patent publication US2019/010778, which is incorporated herein by reference. Such a metrology device may use relatively simple sensor optics with unexceptional or even relatively mediocre aberration performance. As such, the sensor optics may be allowed to have aberrations, and therefore produce a relatively aberrated image. Of course, simply allowing larger aberrations within the sensor optics will have an unacceptable impact on the image quality unless something is done to compensate for the effect of these optical aberrations. Therefore, computational imaging techniques are used to compensate for the negative effect of relaxation on aberration performance within the sensor optics.

In such an approach, the intensity and phase of the target is retrieved from one or multiple intensity measurements of the target. The phase retrieval may use prior information of the metrology target (e.g., for inclusion in a loss function that forms the starting point to derive/design the phase retrieval algorithm). Alternatively, or in combination with the prior information approach, diversity measurements may be made. To achieve diversity, the imaging system is slightly altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements.

The phase retrieval arrangement is required to determine the relative phase between the two targets. In general, phase retrieval does not necessarily guarantee this. For example, this is not typically possible from only a single measurement at best focus, because there is insufficient information. Sufficient information can be obtained when the fields emitted by both targets interfere; however when in-focus, diffraction orders from each target tend to be narrow and therefore do not interfere with diffraction orders from the other target. Therefore, to ensure that the phase relationship of the two targets are sufficiently well-defined, methods such as those described above to ensure the phase relationship is sufficiently well-defined between the first and second gratings can be employed. In this way, the phase relationship between the two gratings of each target, and between the two targets of an (e.g., DBO-type) compound target, will be sufficiently well-defined.

The phase retrieval itself may be based on that described in the aforementioned US2019/010778, or in patent application EP17199764 (also incorporated herein by reference). This describes determining from an intensity measurement, a corresponding phase retrieval such that interaction of the target and the illumination radiation is described in terms of its electric field (amplitude and phase). The intensity measurement may be of lower quality than that used in conventional metrology, and therefore may be out-of-focus as described. The described interaction may comprise a representation of the electric and/or magnetic field immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion, although the location of the model plane is not critical: once amplitude and phase at one plane are known, they can be computationally propagated to any other plane (in focus, out of focus, or even the pupil plane). Alternatively, the description may comprise a complex transmission of the target or a two-dimensional equivalent thereof.

The phase retrieval may comprise modeling the effect of interaction between the illumination radiation and the target on the diffracted radiation to obtain a modelled intensity pattern; and optimizing the phase and amplitude of the electric field within the model so as to minimize the difference between the modelled intensity pattern and the detected intensity pattern. More specifically, during a measurement acquisition, an image (e.g., of a target) is captured on detector (at a detection plane) and its intensity measured. A phase retrieval algorithm is used to determine the amplitude and phase of the electric field at a plane for example parallel with the target (e.g., immediately above the target). The phase retrieval algorithm uses a forward model of the sensor (e.g. aberrations are taken into account), to computationally image the target to obtain modelled values for intensity and phase of the field at the detection plane. No target model is required. The difference between the modelled intensity values and detected intensity values is minimized in terms of phase and amplitude (e.g., iteratively) and the resultant corresponding modelled phase value is deemed to be the retrieved phase.

The required information for retrieving the phase may come from the diversity (multiple diverse measurements or images). Alternatively, or in combination, prior (target) knowledge may be used to constrain the phase retrieval algorithm. The prior knowledge, for example, may be included in a loss function that forms the starting point to derive/design the phase retrieval algorithm. In such an embodiment, the prior knowledge may be based on certain observations; for example there is much regularity between each image of the multiple images of the target. The multiple images may be obtained in a single measurement (e.g., a measurement using more than one illumination condition. e.g., a multi-wavelength measurement) or from the diversity measurements (different focus levels etc.) already described. It can be observed that, for each image, the target comprises essentially a similar form. In particular, each obtained target image has the same or a very similar position and shape for each region of interest. For example, where the target is a x and y direction compound target, having a general form of a presently used DBO target, each image will generally comprise a region of relatively high intensity having a relatively flat intensity profile corresponding to the position of each target making up the compound target (e.g., a relatively flat intensity profile in each quadrant of a larger square pattern). This similarity between images may be exploited, for example, by means of a generalization of a Total Variation or Vector Total Variation regularization (i.e., imposing an L1 penalty on the gradient of the target image). A benefit of this vector generalization is that it introduces a coupling between e.g., different illumination conditions.

It would be desirable, however, to increase the amount of diversity which can be captured in a single image capture. Mechanically changing focus, and acquiring multiple images at different focus settings in a sequential manner results in a high acquisition time and lower throughput, which is compounded for the need to calibrate the sensor due to moving parts and drift.

As such, disclosed herein is an optical arrangement for measuring images of a target at different focus levels simultaneously (e.g., in a single image capture) without a moving optical element or the need to change an optical element. In this way, measurements can be made faster, and there is no need for an additional calibration of the sensor, other than for the initial setup of the apparatus. Furthermore, the proposed arrangement reduces the computational effort required and therefore reduces hardware costs.

Figure 5:
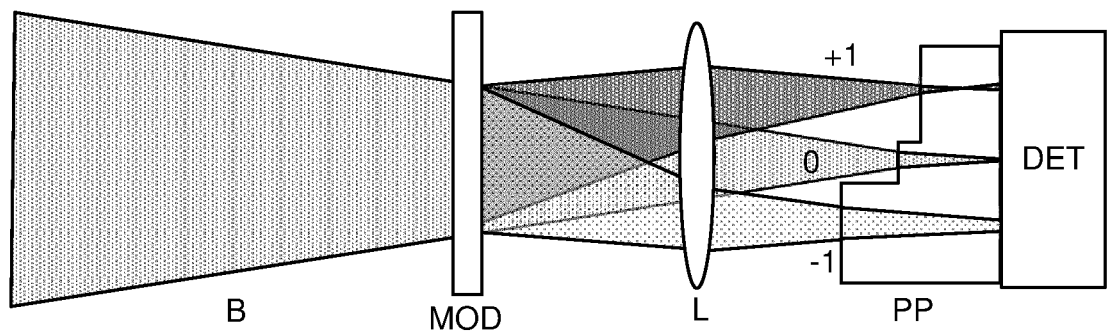
FIG. 5 is a schematic illustration of a first detection arrangement according to an embodiment of the invention, usable as part of a metrology device to obtain focus diversity in a single acquisition.

FIG. 5 shows an embodiment of the proposed concept. A modulator MOD, lens L and a phase plate PP is positioned in the path of the incident beam B, in front of the detector DET (camera). The function of the modulator MOD is to generate multiple copies +1, 0, −1 of the incident beam B (e.g., a beam of scattered radiation following measurement of a target). The lens L acts to focus each of these beam copies onto the detector DET. Phase plate PP imparts a different defocus level to each copy +1, 0, −1 of the incident beam B (or at least some of the beam copies). The modulator MOD may be located within the back focal plane of lens L, for example. The result in a tele centric system, such that all beam copies +1, 0, −1 are incident on the detector DET without tilt.

The phase plate PP may comprise one or more simple optical elements which impose different phase delays on two or more of the beam copies (different diffraction orders). For example, phase plate PP may comprise a transmissive (e.g., glass) stepped plate, having different step heights (different thicknesses) for different regions, each of the regions corresponding to a different beam copy or diffraction order (each defocus level could be defined by a different region of a single element or phase plate, or separate phase plates/optical elements for each beam or a subset of the beam copies). The step heights or thicknesses each determine the amount of defocus for each beam copy. There can be any number of step heights, with a minimum of two and the maximum determined by the size of the image on the sensor and the sensor width. Any other method for imposing different levels of defocus to each beam may be used, such as regions or elements having different refractive indices, rather than (or in addition to) different thicknesses.

The modulator MOD may be, for example, a phase modulator or amplitude modulator. More specifically, modulator may comprise, a grating (e.g., a phase grating and/or amplitude grating), a spatial light modulator (SLM), an acousto-optic modulator (AOM) or electro-optical modulator (EOM). Where an SLM, EOM or AOM is used, in each case it may be used as an amplitude and/or phase modulator. The simplest modulator MOD may be an amplitude grating, which can be used, for example, to split an incident beam into three copies of equal power, at a cost of 15% light loss.

Where the incident beam B is a multiple wavelength beam, the modulator MOD may be a multi-wavelength modulator, for example a multi wavelength (e.g., phase) grating. In another embodiment, an AOM (or EOM) may be used, which has the benefit of enabling tuning of the grating period and the phase delay. The period of a grating, together with the radiation wavelength, determines the angle at which the light is diffracted by the modulator MOD, where longer wavelengths are diffracted at larger angles. Therefore, by appropriate tuning of the modulator MOD period with respect to the illumination wavelength(s), multiple images relating to different defocus levels can spatially be separated on the detector DET. In particular, the intensity in the diffraction orders and the diffraction angle of the diffraction orders can be tuned to match different regions of the stepped phase plate PP. This is especially useful as the wavelength range used in the sensor may be variable between 350 nm and 2000 nm, for example.

This concept can be extended such that diversity in terms of both defocus and wavelength can be captured in a single image. This can be achieved by tuning the modulator MOD period such that two wavelengths can be used simultaneously; i.e., images relating to different wavelengths are spatially separated on the detector, for at least some of the different defocus levels (regions on the stepped phase plate PP).

Figure 6:
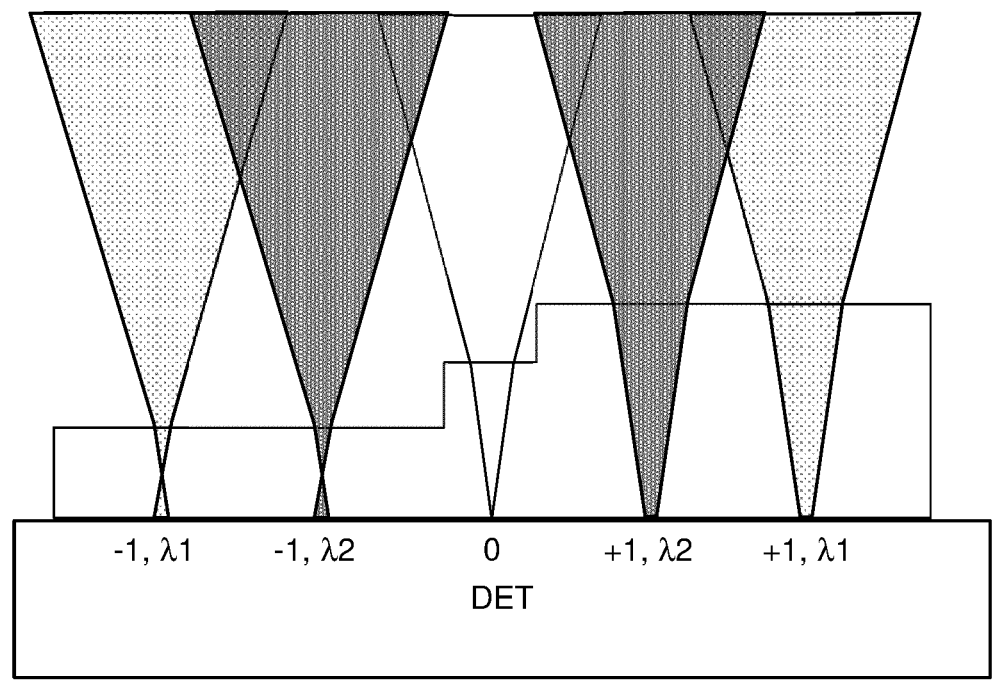
FIG. 6 is a schematic illustration of part of the detection arrangement of FIG. 5, adapted for multiple wavelength capture.

FIG. 6 illustrates a phase plate PP providing images of three orders +1, −1, 0, at two wavelengths $\lambda 1, \lambda 2$. This is, of course, extendable to more orders (modulators or gratings which produce 5, 7 or more orders of equal intensity can be produced) and/or more wavelengths. Note that in such a multiple wavelength embodiment, the zeroth order 0 becomes unusable as it comprises overlapping multiple wavelengths (in contrast to a single wavelength embodiment, where the zeroth order can be used in parallel with the other orders). It should also be noted that the incident illumination on the wafer should be limited to the target only, or else a field stop provided within the sensor, to prevent overlapping images on the detector DET.

The additional path length of the higher diffraction orders with respect to each other and the zeroth order should be taken into account (e.g., where the zeroth order is usable). This can result in a phase plate PP shape which is different than that one is shown in FIG. 5.

Figure 7:
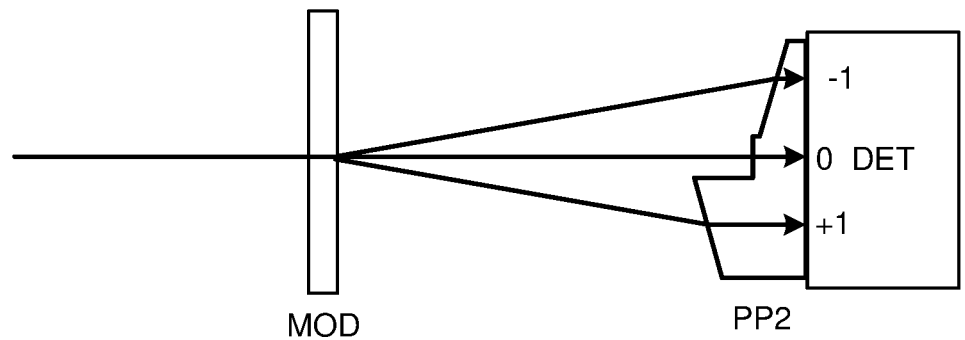
FIG. 7 is a schematic illustration of a second detection arrangement according to an embodiment of the invention, usable as part of a metrology device to obtain focus diversity in a single acquisition.

It should be appreciated that the lens L can be omitted. Uncorrected, this will result in the beam copies (diffraction orders) being incident on the detector DET at an oblique angle. To prevent this, the phase plate PP2 may be provided with a compensatory surface tilt at the appropriate regions (e.g., for all regions other than corresponding to the zeroth order) with the degree and direction of tilt being dependent on the diffraction order, such that the beam copies all have normal incidence on the detector DET. FIG. 7 illustrates the concept, showing an arrangement similar to that of FIG. 5, but without lens L; the phase plate PP2 instead having tilted surfaces corresponding to the +1 and −1 regions.

For phase retrieval, it may be advantageous that the degree of defocus imposed, e.g., by a phase plate, should scale to some degree with wavelength, as smaller wavelengths require a smaller level of defocus to obtain the same amount of phase change. Therefore, in an embodiment, it is proposed that the imposed focus shift should comprise at least a degree of wavelength dependence.

A first approach to impose a wavelength dependent defocus comprises having additional regions (or sub-regions) in the phase plate with different thicknesses for different wavelengths. The proposed arrangement defines a number of sub-region pairs (or, more generally groups) for each diffraction order, such that a first sub-region of a pair corresponds generally with an expected position for a particular diffraction order for a first wavelength and the second sub-region of the pair corresponds generally with an expected position for the same diffraction order for a second wavelength (the diffraction angle being dependent on wavelength). Of course, rather than pairs of sub-regions, larger groups of sub-regions are possible to enable more than one wavelength dependent defocus transition (thickness change) per diffraction order.

Figure 8:
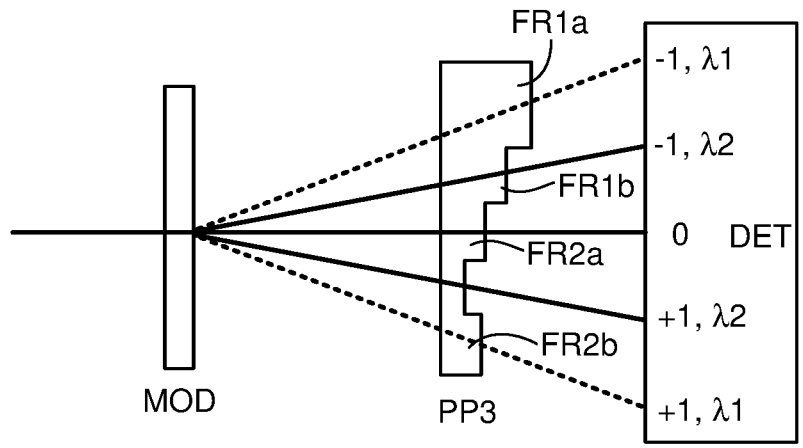
FIG. 8 is a schematic illustration of a third detection arrangement according to an embodiment of the invention, usable as part of a metrology device to obtain focus diversity in a single acquisition.
Figure 9:
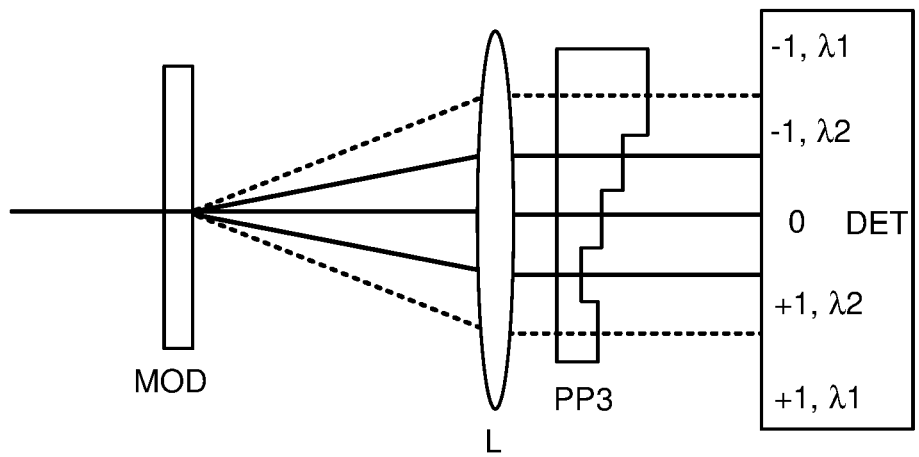
FIG. 9 is a schematic illustration of a fourth detection arrangement according to an embodiment of the invention, usable as part of a metrology device to obtain focus diversity in a single acquisition.

FIG. 8 illustrates a first approach for achieving a wavelength dependent focus shift. In this embodiment, a phase plate PP3 comprises a first pair of focus sub-regions FR1$a$, FR1$b$ for the −1 diffraction orders of respectively two wavelengths $\lambda 1$, $\lambda 2$ and a second pair of focus sub-regions FR2$a$, FR2$b$ for the +1 diffraction orders of respectively the two wavelengths $\lambda 1$, $\lambda 2$. As such, the phase plate PP3 may comprise additional (sub-)regions of different thickness (or different refractive indices) per wavelength of two or more wavelengths, per diffraction order (beam copy). In this manner, the level of phase change imposed by phase plate PP3 can be more constant when switching from first wavelength $\lambda 1$ to second wavelength $\lambda 2$. The zeroth order may correspond with a single region as before, as its angle/position has no wavelength dependence. Such a method can also be used to simultaneously image the different wavelengths $\lambda 1$, $\lambda 2$ in a manner similar to that illustrated in FIG. 6. FIG. 9 shows essentially the same arrangement as that of FIG. 8, but with lens L to obtain perpendicular incidence of each diffraction order on the detector DET.

One issue with a discrete stepped arrangement as illustrated in FIGS. 8 and 9, is that the phase plate PP3 has a fixed boundary or transition region, while the wavelength can be varied within a continuous range. The wavelength is typically optimized for a particular measurement, for example a wavelength which shows best sensitivity to the structure/stack being measured. However, it is possible that a wavelength is selected which corresponds with a transition area on the phase plate PP3, which would result in unusable images. To address this, it is proposed that the location of the boundary region be varied for at least corresponding pairs of diffraction orders, e.g., the boundary for a first pair of focus regions FR1$a$, FR1$b$, corresponding to the −1 diffraction orders is different to the boundary for a second pair of focus regions FR1$a$, FR1$b$, corresponding to the +1 diffraction orders. This should ensure that at least one of these higher orders is usable along with the zeroth order. Of course, the goal of this phase plate is to generate as much diversity and therefore as many usable images (or image portions), at different levels of defocus, in a single image capture. Therefore the varying boundary position is preferably used in combination with a phase plate that generates a large number of beam copies (diffraction orders), so that even where one or more of the diffraction orders results in an unusable images, there will still be significant diversity from which to determine phase.

Figure 10:
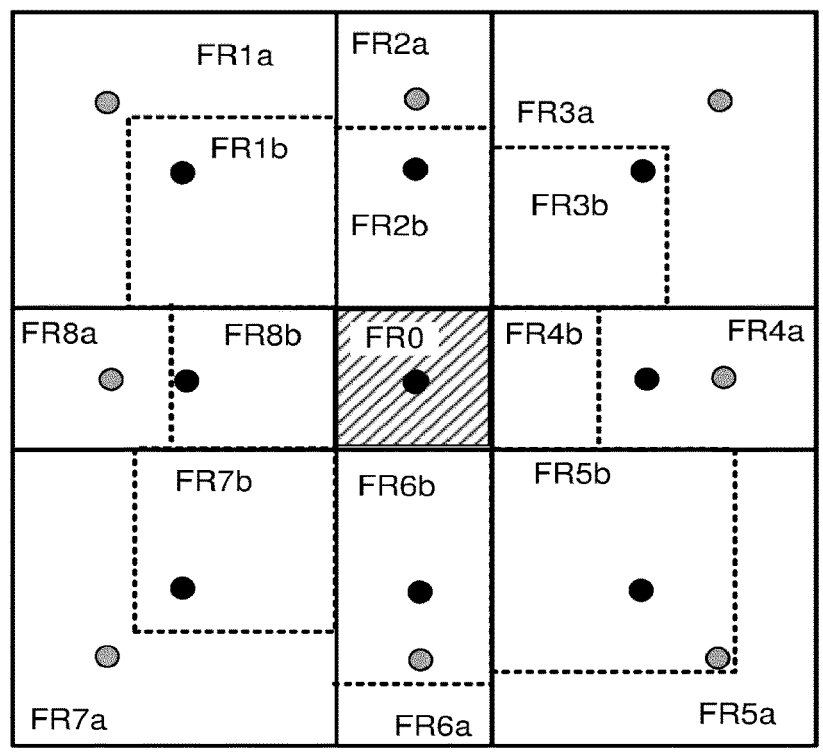
FIG. 10 is a schematic illustration of a phase plate usable to obtain a wavelength dependent focus change, according to an embodiment of the invention

FIG. 10 schematically illustrates an embodiment of a phase plate which addresses this issue. It is proposed that the phase plate is used in a 2-dimensional arrangement where the modulator MOD is a 2-dimensional modulator (e.g., a 2-dimensional grating) FIG. 10 shows the phase plate top-down (e.g., perpendicular to the optical axis). The phase plate in this diagram comprises a zeroth order region FR0 and eight pairs of focus sub-regions FR1$a$, FR1$b$, FR2$a$, FR2$b$, FR3$a$, FR3$b$, FR4$a$, FR4$b$, FR5$a$, FR5$b$, FR6$a$, FR6$b$, FR7$a$, FR7$b$, FR8$a$, FR8$b$. Also shown are first wavelength higher diffraction orders (black dots) relating to a first wavelength $\lambda 1$ and second wavelength higher diffraction orders (gray dots) relating to a second wavelength $\lambda 2$ (and otherwise being the same diffraction orders as the first wavelength higher diffraction orders). The thickness (or refractive index) between each of the two sub-regions of each pair of sub-regions differs, with a boundary region (dotted line) separating each pair of sub-regions. Also, to ensure diversity, the thicknesses (or refractive indices) of the regions/sub-regions can be varied (e.g., such that, for example, the thickness of FR1$a$, FR1$b$, FR2$a$ and FR2$b$ are all different from each other and possibly one, some or all of the other sub-regions). The actual amount of variation between regions, how the regions vary, the number of regions (and/or the number of diffraction orders captured), the number of regions per diffraction order, the locations of any boundary and any other parameter are all highly tunable/variable, as will be apparent to the skilled person, and only a single example is shown.

It can be seen that the boundary position for each pair of regions is in a different position. This ensures that, for both first wavelength $\lambda 1$ and second wavelength $\lambda 2$, there are a good number of diffraction orders away from the transition region, therefore providing usable images. It will be appreciated that this should be the case for whatever wavelength is used (with a particular range).

Figure 11A:
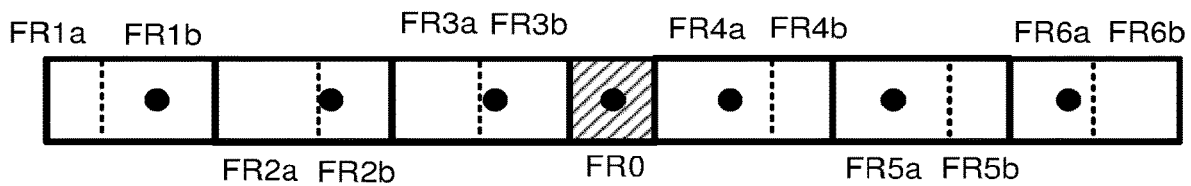
FIGS. 11(a)-11(b) are
Figure 11B:
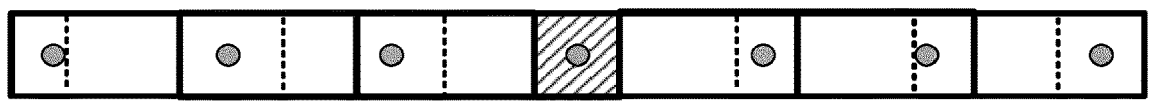

FIG. 11 shows an alternative phase plate to that illustrated in FIG. 10. The phase plate is essentially a one-dimensional version of that illustrated in FIG. 10, to be used with a 1-dimensional modulator (e.g., grating). Other than this, the basic concept is the same. In this specific example, the phase plate (and therefore detector) captures 6 diffraction orders (plus the zeroth order); e.g., +/−1, +/−2 and +/−3. Therefore phase plate comprises six focus regions (pairs of sub-regions) FR1$a$, FR1$b$, FR2$a$, FR2$b$, FR3$a$, FR3$b$, FR4$a$, FR4$b$, FR5$a$, FR5$b$, FR6$a$, FR6$b$, in addition to the zeroth order region FR0. As before, the boundary (dotted line) between sub-regions vary in position between different pairs. To illustrate the same principle as that illustrated in FIG. 10, FIG. 11($a$) shows a set of diffraction orders corresponding to a first wavelength $\lambda 1$ and FIG. 11($a$) shows a set of diffraction orders corresponding to a second wavelength $\lambda 2$.

Figure 12:
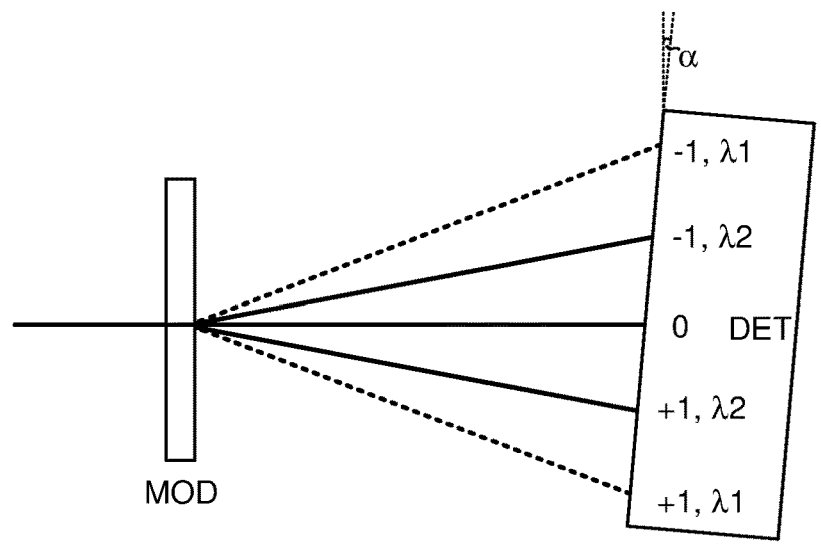
FIG. 12 is a schematic illustration of a further detection arrangement usable to obtain a linear wavelength dependent focus change, according to an embodiment of the invention.

FIG. 12 illustrates an alternative method for achieving a wavelength dependent focus shift. In this method, the detector plane (e.g. camera) defined by detector DET is tilted with respect to the modulator MOD, such as a (e.g., 1-dimensional) phase grating; i.e., such that the detection plane is off-perpendicular with respect to the optical axis. In FIG. 12, the angle of tilt a of the detection plane is small, (e.g., less than 10 degrees, or less than 5 degrees). This has the advantages of providing a linear variation of defocus with wavelength (assuming a tilt angle sufficiently small that the small angle approximation is valid), and no transition regions. Another advantage is that there is no requirement for addition components (e.g., a phase plate) as the shift itself results in the different defocus per order. The fact that the focus changes linearly over the field should be taken into account by the phase retrieval algorithm. This should be possible, for example, by using an algorithm based on a per-pixel approach rather than a full-field approach. As with many of the previous embodiments, a lens may be provided such that the diffraction orders are all parallel with the optical axis/zeroth order, and therefore the tilt in the detection plane is symmetrical with respect to the positive and negative diffraction orders.

Figure 13:
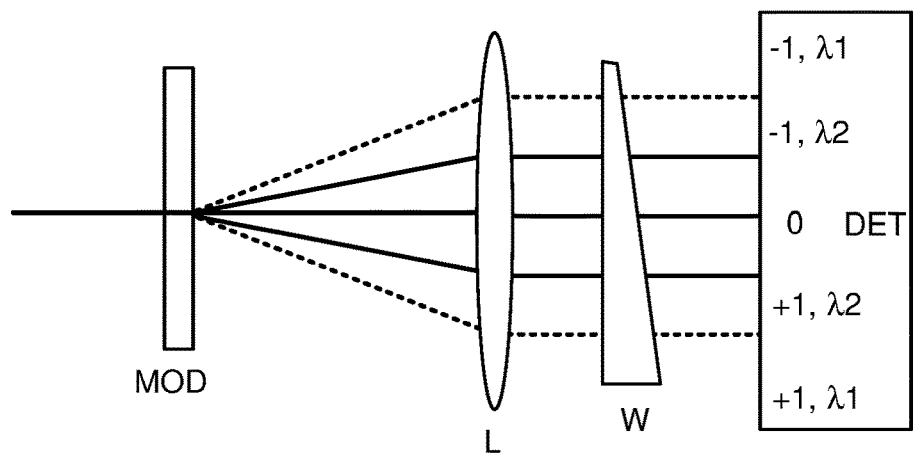
FIG. 13 is a schematic illustration of an alternative detection arrangement usable to obtain a linear wavelength dependent focus change, according to an embodiment of the invention.

FIG. 13 illustrates a variation on the arrangement of FIG. 12, where wedge shaped optical element (or phase plate) W is located between the lens L (if a lens is used as illustrated here) or modulator MOD and the detector D (which is now orientated vertically; i,e., normal to the optical axis). The wedge imposes a continuous wavelength dependent focus dependency in much the same manner as the tilted detection plane embodiment already described, while enabling a normal incidence on (and with respect to) the detector. In either of the arrangements of FIGS. 12 and 13, it is possible to obtain an approximate factor 2 focus step for each octave in bandwidth.

Figure 14:
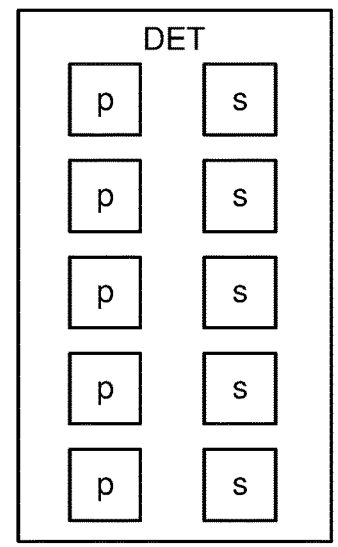
FIG. 14 is a schematic illustration of a captured image on a detector, from a detection arrangement according to an embodiment of the invention having wavelength dependent focus change and polarization diversity.

The concept can be expanded by providing a polarizing beamsplitter or other equivalent optical element (e.g., a Wollaston prism or calcite beam displacer) at a suitable location in the optical path, such as in a position before or after the modulator MOD. This will spatially split the incident beam into its two polarizations, thereby providing additional diversity to aid phase reconstruction. Such a polarizing beamsplitter can be used with any of the embodiments described above. In a specific example, for any of the 1-dimensional wavelength dependent focus shift described, the direction normal to the focus by wavelength direction (e.g., the non-tilted direction in the example of FIGS. 12 and 13) can be used to accommodate the two polarizations. A schematic example of the resultant image on the camera is shown in FIG. 14, where the tilt direction is illustrated by the arrow, and for each of the focus positions, an image is captured for each of the p and s polarization states.

Figure 15:
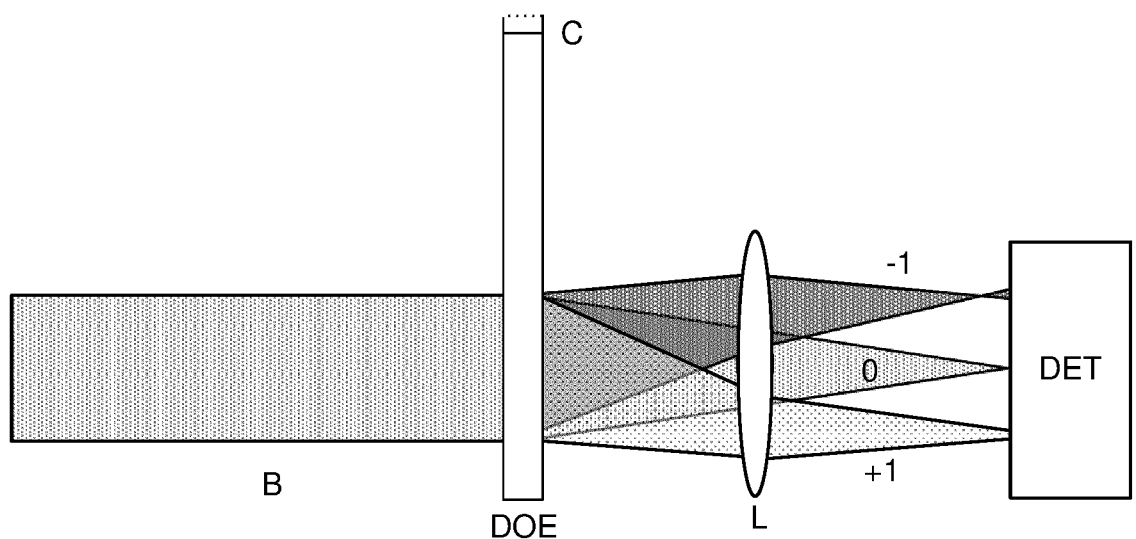
FIG. 15 is a schematic illustration of a further detection arrangement according to an embodiment of the invention, usable as part of a metrology device to obtain focus diversity in a single acquisition.

FIG. 15 illustrates an alternative approach based on the modulator comprising a diffractive structure disclosed in US patent application US 2016/0341969, which is hereby incorporated by reference in its entirety. The diffractive structure, or diffractive optical element (DOE), generates a plurality of different (spatially separated) diffraction orders, each at a different focus. This is achieved by the DOE comprising an approximately parabolic phase (or amplitude) profile, such that the wavefront of the exiting diffraction orders (beam copies) have an added phase delay or optical path delay (OPD) given by:

$$OPD = \frac{m\lambda}{2\pi} a\rho^2$$

where $\lambda$ is the wavelength of the light, m is the diffraction order, $\rho$ the radius from the center of the DOE, and a the parameter for the focus strength.

FIG. 15 illustrates an exemplary optical layout just prior to the detector DET or camera sensor. The DOE is located in the back focal plane of the lens and is decentered with respect to the optical axis. As a result, the diffraction orders −1, 0, +1 are focused telecentrally on the detector DET. Ignoring higher orders (|m|>1), it can be seen that (in this example) the −1 diffraction order is focused ahead of the detector DET, the zeroth order is in focus on the detector DET, and the +1 order is focused behind the detector DET. Because the DOE is decentered (the center is shown as C, with the top section of the DOE not being shown), the grating will introduce a tilt which is dependent on the order. By making an appropriate selection of the focal length of the lens L, all orders will be spatially separated on the detector DET.

The amount of defocus or focus length and the tilt introduced by the DOE is dependent on the wavelength, which is not necessarily ideal. However, the mathematical relation between the wavelength and focus length is known so it can be taken into account by the phase retrieval algorithm. The tilt and focal length of the lens determine the separation of the images on the sensor. Larger wavelengths introduce larger tilts. This effect should be taken into account when designing the sensor. The required image separation, focal length of the lens, tilt and sensor size should be optimized such that the images do not overlap for all wavelengths.

Figure 16:
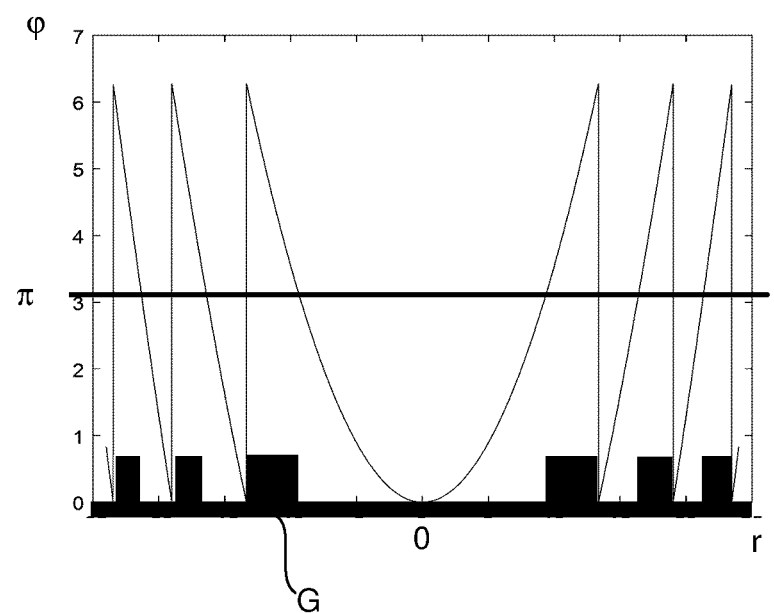
FIG. 16 is a plot of phase against radius position illustrating an exemplary phase profile of a diffractive optical element usable in the detection arrangement of FIG. 15; and FIGS. is 17(a)-(b) are schematic illustrations illustration of 17(a) a metrology device to obtain focus diversity in a single acquisition, and 17(b) a further detection arrangement according to an embodiment of the invention, forming a part of the metrology device of FIG. 17(a).

The DOE may comprise a phase grating having troughs, the edges of which each being located such that the phase modulo $2\pi$ crosses the value n. This is illustrated in the plot of phase $\varphi$ against radius r in FIG. 16, with the grating structure G illustrated at the bottom of the plot. The step height in the glass material may be determined by the wavelength and the refractive index of the DOE material. In a multi wavelength embodiment, a simple stepped phase grating is not useful as the diffraction efficiency between the orders will vary between 0% and 41%. However, suitable phase gratings which work over a wide wavelength range are known and can be used. Alternatively, an amplitude grating may be used instead. This removes the phase delay problem at the cost of a factor of 2 in transmission.

FIG. 17 illustrates a further embodiment wherein the modulator comprises a lens which modulates the geometric phase of an optical beam by manipulating its polarization. Such a lens may comprise a geometric phase lens GPL which can be used in combination with a polarization detection image detector $DET_{POL}$ in order to perform simultaneous generation and imaging of two out-of-focus image planes to obtain a pair of images at first and second defocus levels.

A geometric phase lens GPL or a flat lens is a lens for which the geometric phase (Pancharatnam phase) is utilized to create the lensing effect. The geometric phase lens GPL may comprise a liquid crystal polymer film where the local orientation of the polymers are changed so as to act as a half wave retarders. The angle of the fast axis is spatially changed so as to impose a quadratic geometric phase pattern on the exiting wavefront.

The geometric phase lens's GPL focal length is dependent on the input polarization state. In a typical configuration, it may be arranged to focus right circularly polarized light and defocus left circularly polarized light. If unpolarized light is used, the geometric phase lens GPL generates both focused and unfocussed light distributions. This fact can be exploited in combination with the use of a polarization resolved camera to perform simultaneous detection of positive and negative defocus images (two defocused images are the minimum number required for phase retrieval).

Figure 17A:
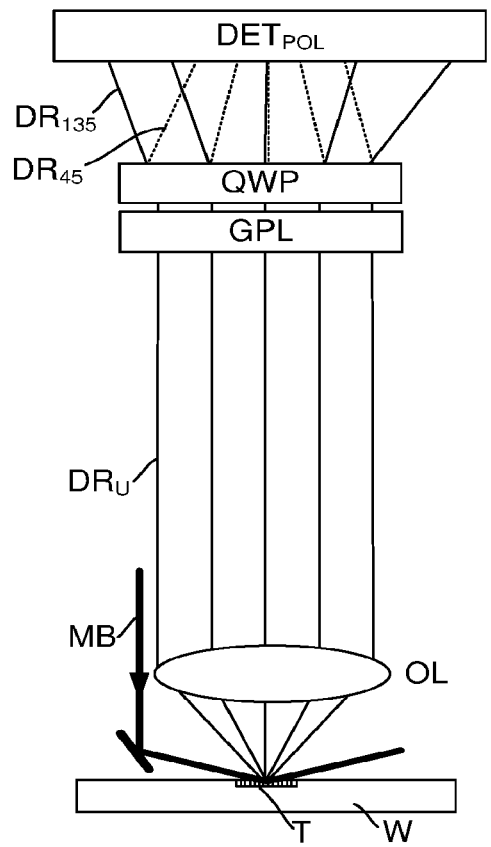
Figure 17B:
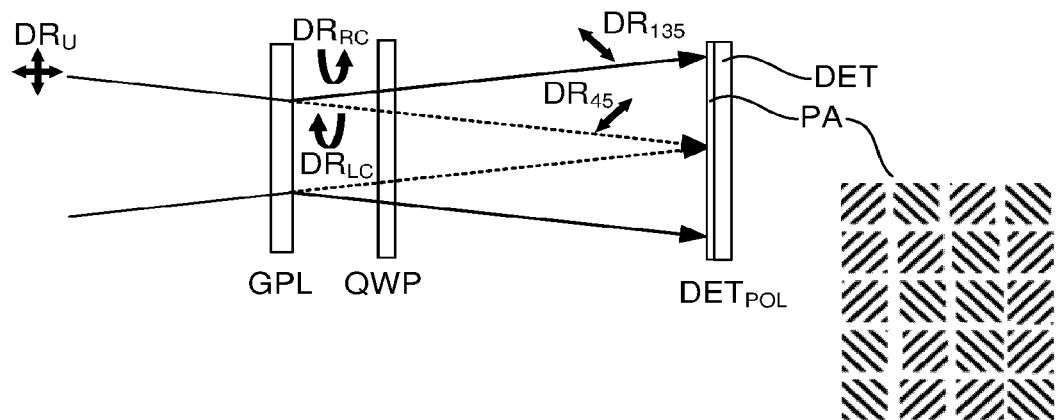

FIG. 17(a) schematically shows a measurement arrangement and FIG. 17(b) shows a detail of the detection arrangement thereof. A measurement beam MB of unpolarized light is used for illumination of a target T on substrate W. This results in diffracted radiation $DR_U$ from the target T, captured by objective lens OL, also being unpolarized. In the proposed arrangement the geometric phase lens GPL is used as a second imaging lens but it is deliberately placed out of focus (i.e., for both of a first and second polarization component of the unpolarized diffracted radiation $DR_U$). The geometric phase lens GPL creates a positive focus (first focal length) for the first polarization component; e.g., a left circular polarization $DR_{LC}$ and a negative focus (second focal length) for the second polarization component; e.g., a right circular polarization $DR_{RC}$. A quarter wave plate QWP is placed after the geometric phase lens GPL with its fast axis perpendicular to the plane of the drawing. This converts the left circular polarization $DR_{LC}$ of the first polarization component to a first linear polarization; e.g., +45 degrees radiation $DR_{45}$ and converts the right circular polarization $DR_{LC}$ of the second polarization component to a second linear polarization e.g., +135 degrees radiation $DR_{135}$.

The two polarizations $DR_{45}$, $DR_{135}$ are mutually orthogonal and can be detected with polarization detection image detector $DET_{POL}$. This may comprise a camera DET with a micropolarizer array PA placed in front of the sensor pixels. The micropolarizer array PA has two polarization directions (a detail illustrating this is shown in FIG. 17(b)). The micropolarizer array PA may be such that every alternate pixel detects 45 and 135 degree polarization respectively.

The measured image is re-arranged and the two out of focus images are detected. The configuration above generates two images which are out of focus. These images can then be used for phase retrieval.

The equivalent defocus distance at wafer level can be estimated by the following formula, where $f_{gpl}$ is the focal length of the geometric phase lens GPL and M is the magnification:

$$\Delta f = \frac{f_{gpl}}{M^2}$$

If, for example, the focal length of the geometric phase lens GPL, $f_{gpl}$ is 200 mm and that of the objective lens OL is 2 mm, then M=100 and the two images are imaged with an equivalent to a defocus of 20 μm, which is suitable for phase retrieval purposes.

The above approaches can be used in any metrology device where it is desirable to obtain focus diversity in a single image capture. In particular the above approaches are particularly suitable in a metrology device which uses a phase retrieval technique (computational imaging), from the captured images, as increased (e.g., focus) diversity will aid the phase retrieval. Such phase retrieval techniques find utility, for example, in improving the quality of abberated images, allowing for a consequent relaxation on the quality of the optics within such a metrology device.

Further embodiment are disclosed in the subsequent numbered clauses:

1. A detection apparatus for simultaneous acquisition of multiple images of an object at a plurality of different focus levels; comprising:
   a modulator for obtaining multiple beam copies of an incoming beam; and
   a detector operable to capture said multiple beam copies, such that at two of said multiple beam copies are captured at different focus levels.
2. A detection apparatus as defined in clause 1, further comprising an optical element operable to impose different phase delays to at least two of said multiple beam copies.
3. A detection apparatus as defined in clause 2, wherein said optical element is operable to impose different phase delays to each of said multiple beam copies.
4. A detection apparatus as defined in clause 2 or 3, wherein the optical element comprises a phase plate.
5. A detection apparatus as defined in clause 2, 3 or 4, wherein the optical element comprises at least two regions having a different thickness and/or refractive index, so as to impose said different phase delays to at least two of said multiple beam copies.
6. A detection apparatus as defined in clause 5 wherein said at least two regions comprise a different region corresponding to each of said multiple beam copies, said different regions each having a different thickness and/or refractive index, so as to impose said different phase delays to each of said multiple beam copies.
7. A detection apparatus as defined clause 5 or 6, wherein at least some of said at least two regions comprise at least two sub-regions, each sub-region of a region having a different thickness and/or refractive index, each sub-region of a region corresponding to a different wavelength range of a corresponding beam copy.
8. A detection apparatus as defined in clause 7, wherein the boundary between two sub-regions of a region is in a different effective location relative to the optical axis for at least complementary pairs of diffraction orders.
9. A detection apparatus as defined in clause 8, wherein said modulator is a two-dimensional modulator and said optical element is a two-dimensional optical element
10. A detection apparatus as defined in any of clauses 2 to 4, wherein the optical element is wedge shaped.
11. A detection apparatus as defined in clause 1, wherein said modulator comprises a diffractive optical element such that it generates said multiple beam copies as diffraction orders at a plurality of focal positions.
12. A detection apparatus as defined in clause 11, wherein the diffractive optical element is decentered with respect to an optical axis of the detection apparatus.
13. A detection apparatus as defined in clause 11 or 12, wherein said diffractive optical element comprises at least one of an approximately parabolic phase profile or an approximately parabolic amplitude profile.
14. A detection apparatus as defined in any preceding clause, wherein the modulator is a diffractive element operable to diffract the incoming beam, such that said multiple beam copies comprise different diffraction orders.
15. A detection apparatus as defined in clause 14, wherein said multiple beam copies further comprise like diffraction orders corresponding to two or more different wavelengths, and said modulator is such that the multiple beam copies corresponding to two or more different wavelengths are individually resolved on the detector.
16. A detection apparatus as defined in any preceding clause, further comprising a polarizing splitter such that said multiple beam copies comprise equivalent beam copies of different polarizations.
17. A detection apparatus as defined in any preceding clause, wherein said modulator is one of a grating, a spatial light modulator, an acousto-optic modulator or an electro-optical modulator.
18. A detection apparatus as defined in any preceding clause, wherein the optical element has two or more tilted surfaces to direct said beam copies along a path parallel the optical axis of the detection system.
19. A detection apparatus as defined in any of clauses 1 to 17, comprising a lens to direct said beam copies along a path parallel the optical axis of the detection system.
20. A detection apparatus as defined in clause 1, wherein said modulator comprises a geometric phase lens comprising a first focal length for a first polarization component of the incoming beam and a second focal length for a second polarization component of the incoming beam; and said detector is operable to separately detect said first polarization component and said second polarization component.
21. A detection apparatus as defined in clause 20, wherein said first polarization component comprises a first circular polarization and said second polarization component comprises a second circular polarization; and said detection apparatus comprises a quarter wave plate to convert said first circular polarization to a first linear polarization and convert said second circular polarization to a second linear polarization, said second linear polarization being orthogonal to said first linear polarization, prior to detection by the detector.

22. A detection apparatus as defined in clause 21, wherein the detector comprises a micropolarizer array having a micropolarizer per pixel of the detector, each micropolarizer having one of two polarization directions arranged such that alternate pixels respectively detect said first linear polarization and said second linear polarization.

23. A detection apparatus for simultaneous acquisition of a pair of images of an object at first and second defocus levels, comprising:
a geometric phase lens comprising a first focal length for a first polarization component of an incoming beam of unpolarized radiation and a second focal length for a second polarization component of the incoming beam of unpolarized radiation; and
a detector operable to separately detect said first polarization component and said second polarization component to obtain said pair of images.

24. A detection apparatus as defined in clause 23, wherein said first polarization component comprises a first circular polarization and said second polarization component comprises a second circular polarization; and said detection apparatus comprises a quarter wave plate to convert said first circular polarization to a first linear polarization and convert said second circular polarization to a second linear polarization, said second linear polarization being orthogonal to said first linear polarization, prior to detection by the detector.

25. A detection apparatus as defined in clause 24, wherein the detector comprises a micropolarizer array having a micropolarizer per pixel of the detector, each micropolarizer having one of two polarization directions arranged such that alternate pixels respectively detect said first linear polarization and said second linear polarization.

26. A detection apparatus as defined in any preceding clause, wherein each of said beam copy has the same intensity.

27. An inspection apparatus or a metrology apparatus comprising:
a substrate holder for holding a substrate comprising a structure,
projection optics for projecting illuminating radiation onto the structure;
the detection apparatus of any preceding clause for detecting said illuminating radiation subsequent to it having been scattered by the structure; and
a processor operable to calculate a value for a performance parameter relating to the structure directly from the effect of the performance parameter on the phase of illuminating radiation, as calculated using one or more detected characteristics of said multiple beam copies captured at different focus levels.

28. The inspection apparatus as defined in clause 27, wherein the processor is operable to determine at least one electric field relating to said radiation scattered by the first structure using said one or more detected characteristics of said multiple beam copies captured at different focus levels.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatuses. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A metrology apparatus comprising:
a substrate holder configured to hold a substrate comprising a structure;
projection optics configured to project illuminating radiation onto the structure;
a detection apparatus configured to simultaneously acquire multiple images of an object at a plurality of different focus levels and to detect the illuminating radiation subsequent to it having been scattered by the structure, the detection apparatus comprising:
a modulator configured to obtain generate multiple beam copies of an incoming beam;
an optical element configured to impose different phase delays to at least two of the multiple beam copies;

a detector operable to capture the multiple beam copies,
wherein the modulator is configured such that at least two of the multiple beam copies are captured at different focus levels; and
a processor operable to calculate a value for a performance parameter relating to the structure directly from the effect of the performance parameter on a phase of illuminating radiation, as calculated using one or more detected characteristics of the multiple beam copies captured at the different focus levels.

2. The metrology apparatus of claim 1, wherein the modulator is a diffractive element operable to diffract the incoming beam, such that the multiple beam copies comprise different diffraction orders.

3. The metrology apparatus of claim 2, wherein:
the multiple beam copies further comprise like diffraction orders corresponding to two or more different wavelengths; and
the modulator is such that the multiple beam copies corresponding to the two or more different wavelengths are individually resolved on the detector.

4. The metrology apparatus of claim 1, further comprising a polarizing splitter such that the multiple beam copies comprise equivalent beam copies of different polarizations.

5. The metrology apparatus of claim 1, wherein the modulator comprises one of a diffractive optical element, a phase plate, a geometric phase lens optionally combined with a quarter wave plate, a grating, a spatial light modulator, an acousto-optic modulator or an electro-optic modulator.

6. The metrology apparatus of claim 1, wherein the optical element is operable to impose different phase delays to each of the multiple beam copies.

7. The metrology apparatus of claim 1, wherein the optical element comprises a phase plate.

8. The metrology apparatus of claim 1, wherein the optical element comprises at least two regions having different thicknesses and/or refractive indices, so as to impose the different phase delays to at least two of the multiple beam copies.

9. The metrology apparatus of claim 8, wherein the at least two regions comprise a different region corresponding to each of the multiple beam copies, the different regions each having a different thickness and/or refractive index, so as to impose the different phase delays to each of the multiple beam copies.

10. The metrology apparatus of claim 8, wherein at least some of the at least two regions comprise at least two sub-regions, each of the at least two sub-regions having a different thickness and/or refractive index, each of the at least two sub-regions corresponding to a different wavelength range of a corresponding beam copy.

11. The metrology apparatus of claim 10, wherein:
a boundary between the at least two sub-regions is in a different effective location relative to an optical axis for at least complementary pairs of beam copies;
the modulator is a two-dimensional modulator; and
the optical element is a two-dimensional optical element.

12. The metrology apparatus of claim 1, wherein the optical element is wedge shaped.

13. The metrology apparatus of claim 1, wherein the optical element has two or more tilted surfaces to direct the multiple beam copies along a path parallel to an optical axis of the detection apparatus.

14. A detection apparatus comprising:
a modulator configured to generate multiple beam copies of an incoming beam;
an optical element configured to impose different phase delays to at least two of the multiple beam copies; and
a detector configured to capture the multiple beam copies,
wherein the modulator is configured such that at least two of the multiple beam copies are captured at different focus levels,
wherein the optical element comprises at least two regions having different thicknesses and/or refractive indices, so as to impose the different phase delays to at least two of the multiple beam copies,
wherein at least some of the at least two regions comprise at least two sub-regions, each of the at least two sub-regions having a different thickness and/or refractive index, each of the at least two sub-regions corresponding to a different wavelength range of a corresponding beam copy,
wherein at least some of the at least the two regions comprise at least two sub-regions having a different thickness and/or refractive index, wherein a boundary between the at least two sub-regions is in a different effective location relative to an optical axis for at least complementary pairs of beam copies, and
wherein the boundary between the at least two sub-regions is in a different effective location relative to the optical axis for at least complementary pairs of beam copies, wherein the modulator is a two-dimensional modulator, and wherein the optical element is a two-dimensional optical element.

* * * * *

UNITED STATES PATENT AND TRADEMARK OFFICE
CERTIFICATE OF CORRECTION

| | |
|---|---|
| PATENT NO. | : 12,086,973 B2 |
| APPLICATION NO. | : 17/608015 |
| DATED | : September 10, 2024 |
| INVENTOR(S) | : Tukker et al. |

It is certified that error appears in the above-identified patent and that said Letters Patent is hereby corrected as shown below:

In the Specification

In Column 3, Line 4, after "are" delete "FIG. 11 is a";

In Column 3, Line 5, after "illustrations" delete "illustration";

In Column 3, Line 27, after "FIGS." delete "is";

In Column 3, Line 27, after "illustrations" delete "illustration".

In Column 14, Line 6, delete "n." and replace with --$\pi$.--.

Signed and Sealed this
Twenty-ninth Day of October, 2024

Katherine Kelly Vidal
*Director of the United States Patent and Trademark Office*